United States Patent [19]

Uchino et al.

[11] Patent Number: 5,761,117
[45] Date of Patent: Jun. 2, 1998

[54] NON-VOLATILE MULTI-STATE MEMORY DEVICE WITH MEMORY CELL CAPABLE OF STORING MULTI-STATE DATA

[75] Inventors: Takashi Uchino; Nozomu Nambu, both of Ora-gun; Akio Hagiwara, Osato-gun, all of Japan

[73] Assignee: Sanyo Electric Co., Ltd., Osaka, Japan

[21] Appl. No.: 697,687

[22] Filed: Aug. 29, 1996

[30] Foreign Application Priority Data

Aug. 31, 1995 [JP] Japan ................................. 7-224383

[51] Int. Cl.$^6$ ............................................. G11C 11/34
[52] U.S. Cl. ........................... 365/185.03; 365/185.18
[58] Field of Search ..................... 365/185.03, 185.01, 365/185.33, 185.24, 185.19, 185.18

[56] References Cited

U.S. PATENT DOCUMENTS

5,583,816  12/1996  Harari .......................... 365/185.03

Primary Examiner—Joseph A. Popek
Assistant Examiner—Hoai V. Ho
Attorney, Agent, or Firm—Loeb & Loeb LLP

[57] ABSTRACT

Inputted digital data are held in a data register and converted to multi-state analog amount by a resistance dividing circuit and a decoder. A comparator compares an analog amount read from a non-volatile memory cell with a converted analog amount; and in accordance with this comparison result, a writing voltage is supplied to a memory cell. A first bias generating circuit is provided for generating two different types of bias voltages as this writing voltage. MOS transistors are inserted as respective switches to the bias voltage supply lines and writing voltages are switched by selectively ON/OFF-controlling one of the MOS transistors in accordance with the upper bit of the inputted digital data. As a result, unnecessary writing time can be eliminated, time required for executing writing can be reduced and circuit configuration can be simplified.

16 Claims, 11 Drawing Sheets

Fig. 7(a) REAEN
Fig. 7(b) ADRX[5:0]
Fig. 7(c) REAEN2 (300LU)
Fig. 7(d) REAEN2 (300LL)

Fig. 9 (a) RWCK3

Fig. 9 (b) REAEN2

Fig. 9 (c) X SET

Fig. 9 (d) COMP

Fig. 9 (e) D1, D0

Fig. 9 (f) Vdec

Fig. 9 (g) RWCK4

| DATA D1 D0 | VOLTAGE |
|---|---|
| 0  0 | V1 |
| 0  1 | V2 |
| 1  0 | V3 |
| 1  1 | V4 |

| OPERATION STATE | DRAIN (BL) | SOURCE (SL) | CONTROL GATE (WL) |
|---|---|---|---|
| ERASE | 0 V | 0 V | $V_{hv2}$ |
| WRITE 1 | $V_{BLH}$ | $V_{hv1}$ | $V_{B2}$ |
| WRITE 2 | $V_{BLL}$ | $V_{hv1}$ | $V_{B2}$ |
| WRITE STOP | $V_{BH}$ | $V_{hv1}$ | $V_{B2}$ |
| READ | $V_{REFM}$ | 0 V | $V_{B1}$ |

($V_{hv2}$>$V_{hv1}$>$V_{BH}$=$V_{B1}$>$V_{B2}$>$V_{BLH}$=$V_{REFM}$>$V_{BLL}$>0V)

Fig. 11

Fig. 12 a non-volatile multi-state memory cell capable of storing
multi-state information. a comparator for comparing an
analog amount read from the memory cell with an analog
amount converted by the converting circuit, a writing circuit
for supplying a writing voltage to the memory cell in
response to a comparison result from the comparator in
order to write the multi-state analog amount and a switching
circuit for switching the writing voltage supplied to the
memory cell in accordance with the inputted digital data.

Furthermore, in addition to the configuration described
above, the present invention also has a data register for
holding the inputted digital data, an analog voltage generating circuit for generating a plurality of analog voltages of
differing voltage values and a decoder for decoding the
content of data held in the data register and selectively
outputting one of the plurality of analog voltages in response
to the content of the respective data. The comparator compares a voltage corresponding to an analog amount read
from the memory cell with an analog outputted from the
decoder. The writing circuit supplies the writing voltage to
the memory cell in accordance with the respective comparator result, and the switching circuit switches the writing
voltage in accordance with the inputted digital data. The
above-mentioned objectives can also be achieved with this
configuration.

Moreover, the present invention is also characterized in
that the switching circuit comprises a voltage generating
circuit for generating a plurality of writing voltages having
differing voltage values and a selecting circuit for selecting
any one of the plurality of writing voltages in accordance
with the inputted digital data.

Furthermore, the memory cell consists of an EEPROM
element.

DESCRIPTION OF THE PREFERRED EMBODIMENT

Figure 5:
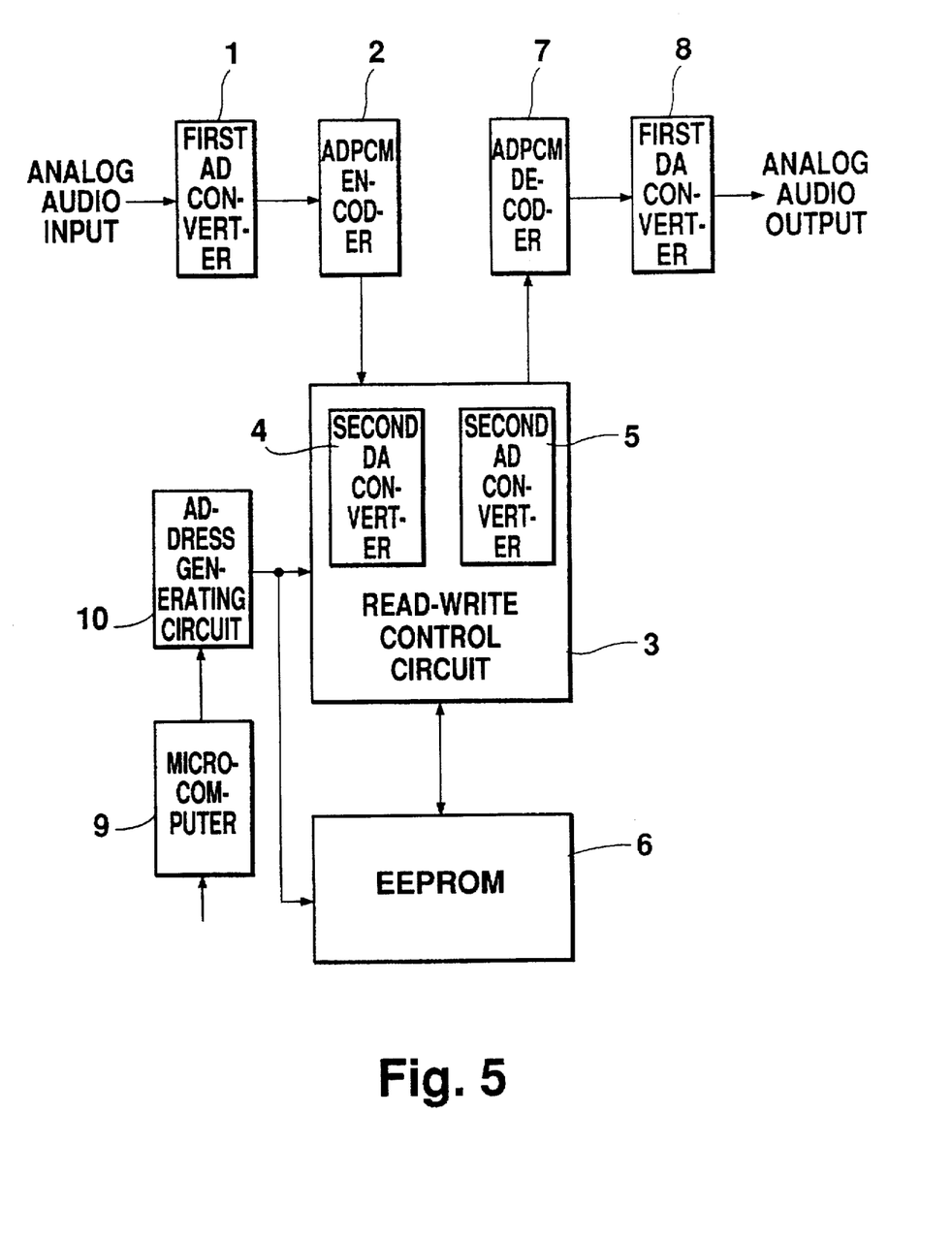
FIG. 5 is an overall diagram of an audio play apparatus
implementing a configuration of the present invention.

FIG. 5 shows a summary block diagram of an audio play apparatus in which the present invention has been implemented.

In this apparatus, in record mode an analog audio signal to be inputted is converted by a first AD converter 1- to 12 bit digital audio data in a designated sampling period and then coded by an ADPCM encoder 2- to 4-bit digital compressed data and sent to a read-write control circuit 3. At the read-write control circuit 3, the 4-bit digital compressed data is converted to an analog signal by an internal second DA converter 4, and this analog signal is written in an EEPROM 6.

Alternatively, in the play-back mode an analog signal is read from the EEPROM 6 by the read-write control circuit 3 and is converted to 4-bit digital compressed data at an internal second AD converter 5. This 4-bit digital compressed data is decoded by an ADPCM decoder 7 into 12-bit digital audio data, and this 12-bit digital audio data is then converted to an analog signal by a first DA converter and outputted as audio sound from a speaker and the like not shown in the diagram.

Furthermore, 20-bit addresses data for writing and reading an EEPROM 6 are created by an address generating circuit 10 based on commands and the like inputted from a microcomputer 9 and supplied to the EEPROM 6 and the read-write control circuit 3.

Figure 1:
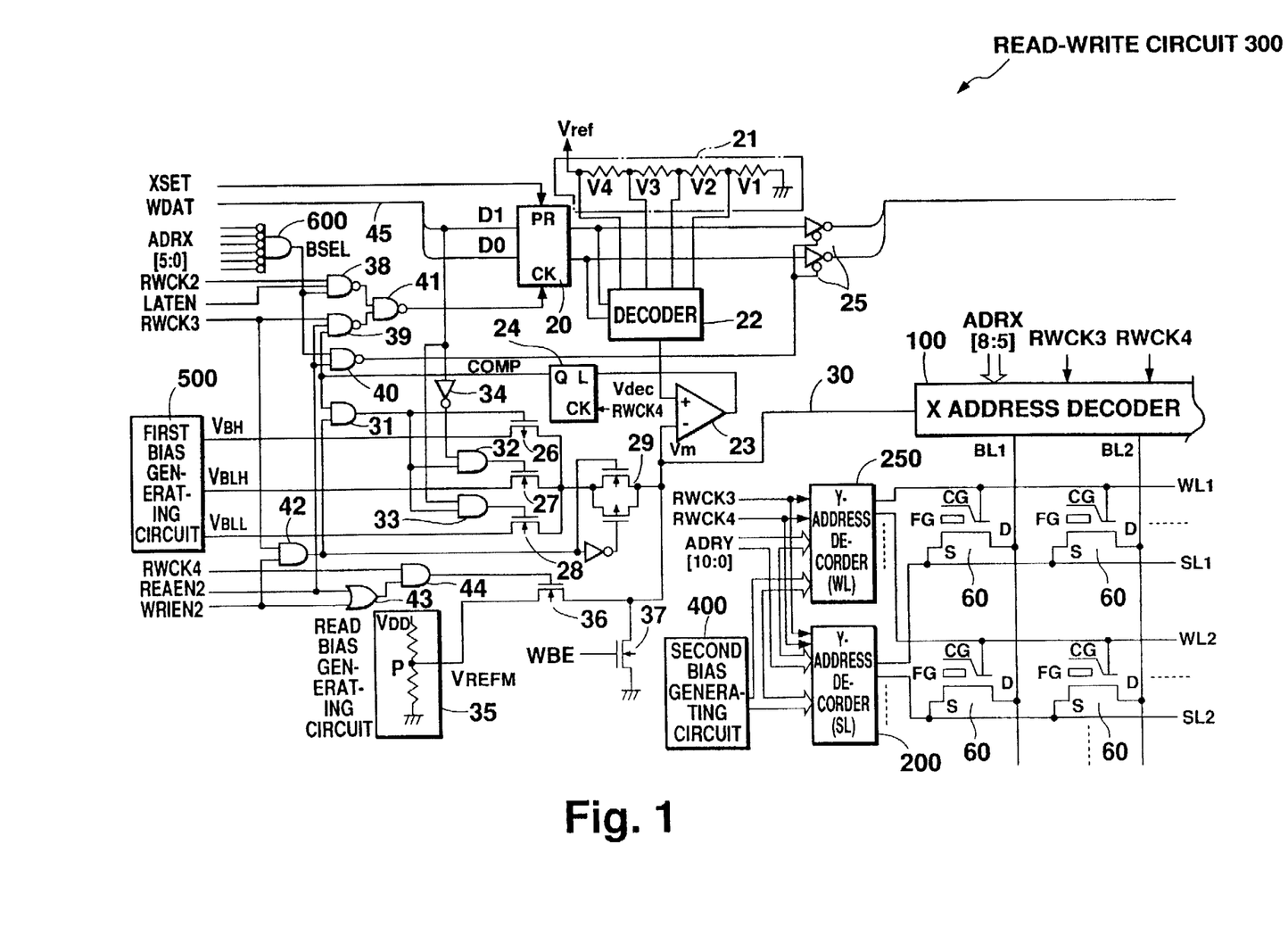
FIG. 1 is a circuit diagram showing a read-writing circuit
in an embodiment of the present invention.

Next, an actual configuration of a read-writing circuit 300 included in the read-write control circuit 3 is shown in FIG. 1.

In FIG. 1; a data register 20 comprised from D flip-flops is a 2-bit data register for capturing and holding the upper or lower 2 bits of 4-bit digital compressed data outputted from an ADPCM encoder 2; a resistance dividing circuit 21 is a circuit for dividing reference voltage Vref into 4 voltages V1~V4 (V1<V2<V3<V4); a decoder 22 decodes the contents of data held in the data register 20 and selectively outputs one of the 4 voltages V1~V4 in accordance with those contents; a comparator 23 is provided an analog voltage Vdec outputted from the decoder 22 to a non-inverting terminal +; and a voltage Vm is read from the memory cell 60 of EEPROM 6 to an inverting terminal −, and compares both these voltages. While a timing clock RWCK 4 is at the H level, a latch circuit 24 outputs the output from the comparator 23 unaltered; and when the clock RWCK 4 chages to the L level, the latch circuit 24 latches the output from the comparator 23 and outputs this latched output during the L level. In addition, an output buffer 25 is a buffer for outputting the content of data held in the data register 20; In other words it is a transmission circuit for transmitting digital data held in the data register 20 to an external portion, and the second DA converter 4 shown in FIG. 5 comprises the output buffer 25, a resistance dividing circuit 21 and a decoder 22.

Each memory cell 60 of the EEPROM 6 is a split gate-type cell with a floating gate FG and carries out writing by injecting an electric charge to the floating gate FG and carries out erasure by extracting the electric charge injected to the floating gate FG. A drain D of each memory cell 60 is connected to a bit line BL1, BL2 . . . , a source S is connected to a source line SL1, SL2, . . . , a control gate CG is connected to a word line WL1, WL2, . . . An X address decoder 100 for decoding an upper 4-bit X address ADRX [8:5] selects one line from each bit line BL1, BL2, . . . and the selected line is connected to the inverting terminal of the comparator 23. The word lines WL1, WL2 . . . and source lines S1, S2 . . . are each connected, respectively, to Y address decoders 200 and 250 which decode an 11-bit Y address [10:0]; and a bias voltage is supplied to these decoders 200, 250 from a second bias generating circuit 400. This bias voltage includes a high voltage bias Vhv 1 for writing and a high voltage bias Vhv 2 for erasing. RWCK 3, RWCK 4 and WBE are inputted to the address decoders 100, 200, 250 as timing signals. Moreover, the terms "drain" and "source" used here refer essentially to the operation condition when reading is executed. A voltage generating circuit, in other words a first bias generating circuit 500, generates three types of bias voltage, VBH, VBLH, and VBLL (VBH>VBLH>VBLL) which have been set as a plurality of writing voltages with differing voltage values for the memory cell 60; and these bias voltages are selectively supplied to each of the bit lines BL1, BL2, . . . by a selecting circuit.

The selecting circuit selects any one of the plurality of writing voltages in response to the inputted digital data, and comprises switches and AND gate 32, 33 which control the switches in response to the upper bit D1 (m bits) of the n-bit digital data (n=2, in this embodiment) supplied to the data register 20.

The three types of bias voltage VBH, VBLH, VBLL (VBH>VBLH>VBLL) supplied to bit lines B1, B2, . . . are outputted from first bias generating circuit 500 and a P channel MOS transistor 26, an N channel MOS transistor 27 and an N channel MOS transistor 28 are inserted respectively as switches at the supply lines for these bias voltages. An analog switch 29 which is switched on only when writing is executed is connected to the output side of these transistors, and output from this analog switch 29 is connected to an input/output line 30 of the X address decoder 100. The COMP output of the latch circuit 24 is inputted at one input end of the AND gate 31. The output of the AND gate 31 is applied to the gate of the P channel MOS transistor 26. The outputs of AND gates 32 and 33 are applied at the gates of N channel MOS transistors 27 and 28, respectively. The output of AND gate 31 is likewise inputted at one input end of AND gates 32 and 33. A signal consisting of the upper bit D1 of the data to be supplied to the data register 20 reversed by an invertor 34 is inputted at the other input end of AND gate 32, and the upper bit D1 of the data to be supplied to the data register 20 is inputted unchanged at the other input end of AND gate 33.

In addition, a read bias generating circuit 35 comprising a resistance dividing circuit is provided in order to read as a voltage. The analog amount written in each memory cell 60 and the voltage division point P is connected to the input/output line 30 for the X address decoder 100 via the N channel MOS transistor 36 which is switched on only when the comparator 23 is executing a comparison. An N channel MOS transistor 37 is inserted between the input/output line 30 and the ground in order to supply ground potentials when memory cell data are erased. This N channel MOS transistor 37 is activated by a control signal WBE and deems the bit lines B1, B2, . . . as ground potentials.

The read-writing circuit 300 shown in FIG. 1 organizes eight memory cells into 1 block in the X address direction and each block is equipped with a block selector 600 in order to detect the fact that it has been selected. In block No. 0 shown in FIG. 1, the block selector 600 consists of an AND gate for detecting whether the lower 6-bit X address ADRX [5:0] is ALL 0.

Moreover in FIG. 1, a sampling clock RWCK 2 and a latch-enable signal LATEN and the block selector 600 output BSEL are inputted to NAND gate 38, a timing clock RWCK 3 and a read-enable signal REAN 2 and COMP output are inputted to NAND gate 39, the block selector 600 output BSEL and a read-enable signal REAEN 2 are inputted to NAND gate 40, and the output of both NAND gates 38 and 39 are inputted to NAND gate 41. The timing clock RWCK 3 and write enable signal WRIEN 2 are inputted to AND gate 42, a read-enable signal REAEN 2 and a write enable signal WRIEN 2 are inputted to OR gate 43, and timing clock RWCK 4 and the output from OR gate 43 are inputted to AND gate 44. The output of NAND gate 41 is applied at a clock terminal CK of the D flip-flop consisting of a data register 20, the output of NAND gate 40 is applied as an ON/OFF control signal of an output buffer 25, the output of AND gate 42 is applied as an ON/OFF control signal of an analog switch 29, and the output of AND gate 44 is applied to the gate of the N channel MOS transistor 36.

Figure 11:
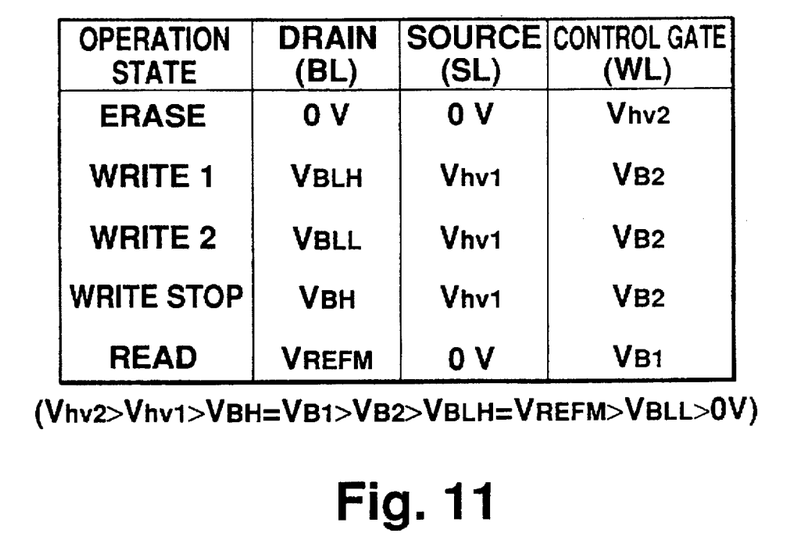
FIG. 11 is a diagram showing a bias condition of a memory cell in an embodiment of the present invention.

The write operation and read operation of the read-writing circuit 300 will next be explained with reference to the timing chart shown in FIGS. 8 and 9. The bias conditions at each operation aspect of the memory cells 60 are as depicted in FIG. 11.

Prior to the writing operation, latch mode commences in order to latch the data in the data register 20. In latch mode, 2 bits of digital data D1 and D0 are sent to an input line 45, the EEPROM 6 addresses ADRX and ADRY at which the data are to be written are sent from the address generating circuit 10 shown in FIG. 5, and the signal LATEN which indicates latch mode rises to the H level. When the lower 6-bit ADRX [5:0] of the outputted X address matches its own block number, the block selector 600 output rises to the H level. In FIG. 1 for instance, the block selector 600 matches block No. 0; i.e., ADRX [5:0] is ALL 0 and outputs the H level. Consequently, the NAND gate 38 output at the start of the sampling pulse RWCK 2 changes to the L level and then the NAND gate 41 output rises to the H level. Therefore, a clock is applied at the D flip-flop clock terminal CK consisting of a data register 20 and input data D1 and D0 are captured by the data register 20.

When capturing is completed, signal WBE rises to the H level, the N channel MOS transistor 37 turns to ON and the input/output line 30 has ground potential 0 V. Since a bit line BL selected by the X address ADRX [8:5] is connected to the input/output line 30 at the X address decoder 100, that bit line BL also becomes 0 V. In addition, since a high voltage bias Vhv 2 for erasure is applied at the selected word line WL by the Y address decoder 250 and 0 V from the Y address decoder address decoder 200 is applied at the source line SL, the selected memory cell is thus erased. In other words, the electric charge to the floating gate FG of the memory cell 60 is extracted.

Once erasure is completed, the operation enters the actual write mode.

In write mode, the signal WRIEN 2 rises to the H level as shown in FIG. 8 (c). Consequently while the clock RWCK 3 is at the H level as in FIG. 8 (d), the output of the AND gate 42 rises to the H level. Moreover, since the latch circuit 24 has been set initially at the H level, the output of the AND gate 31 also rises to the H level. Therefore, the analog switch 29 is now ON and the P channel MOS transistor 26 is OFF.

If the upper bit D1 of the input data is now "0" the AND gate 32 output rises to the H level and therefore the N channel MOS transistor 27 switches ON and the bias voltage VBLH is supplied to the selected bit line BL via the analog switch 29, the input/output line 30 and the X address decoder 100 as shown in FIG. 8 (f). Alternatively, if the upper bit D1 of the input data is "1", the AND gate 33 output rises to the H level, and therefore the N channel MOS transistor 28 switches ON and the bias voltage VBLL is supplied to the selected bit line BL via the analog switch 29, the input/output line 30 and the X address decoder 100.

While the clock RWCK 3 is at the H level, since high voltage Vhv 1 is supplied to the source line SL selected by the Y address decoder 200 (FIG. 8 (h)) and VB2 is supplied to the word line WL selected by the Y address decoder 250 (FIG. 8 (g)), the writing conditions shown in FIG. 11 are therefore satisfied and writing is executed in the memory cell 60. In other words, charge injection to the floating gate FG of the memory cell 60 commences.

Next, the clock RWCK 3 changes to the L level and when clock RWCK 4 rises to the H level as shown in FIG. 8 (e), since the AND gate 42 output changes to the L level and the AND gate 44 output rises to the H level, the analog switch 29 switches to OFF, the N channel MOS transistor 36 turns to ON and the voltage division point P on the read bias generating circuit 35 is connected to the input/output line 30. The potential of the voltage division point P is set at a voltage VREFM slightly higher than V4 when the N channel MOS transistor 36 is OFF. Moreover, in this state, since VB1 is applied to a selected word line WL by the Y address decoder 250 and 0 V is applied to the source line SL by the Y address decoder 200, the selected memory cell 60 is now in the reading state. Thus a voltage Vm corresponding to the charge injected at the floating gate FG of the memory cell 60 is obtained at the input/output line 30, and the comparator 23 then compares this voltage Vm with the voltage Vdec outputted from the decoder 22.

Figure 10:
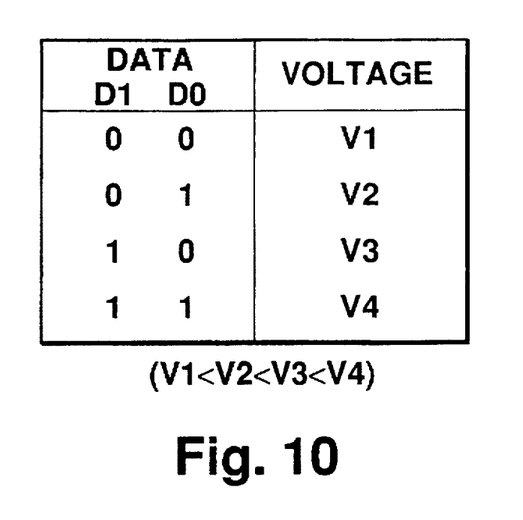
FIG. 10 is a diagram showing the relation between input
digital data and corresponding analog voltage in an embodiment of the present invention.

In response to data latched by the data register 20, the decoder 22 selects an analog voltage of one of the 4 voltages V1~V4 from the resistance dividing circuit 21 and outputs this to the non-inverting terminal of the comparator 23. The relation here between the data D1, D0 and the voltage division values V1~V4 is shown in FIG. 10.

Figures 8A, 8B, 8C, 8D, 8E, 8F, 8G, 8H, 8I:
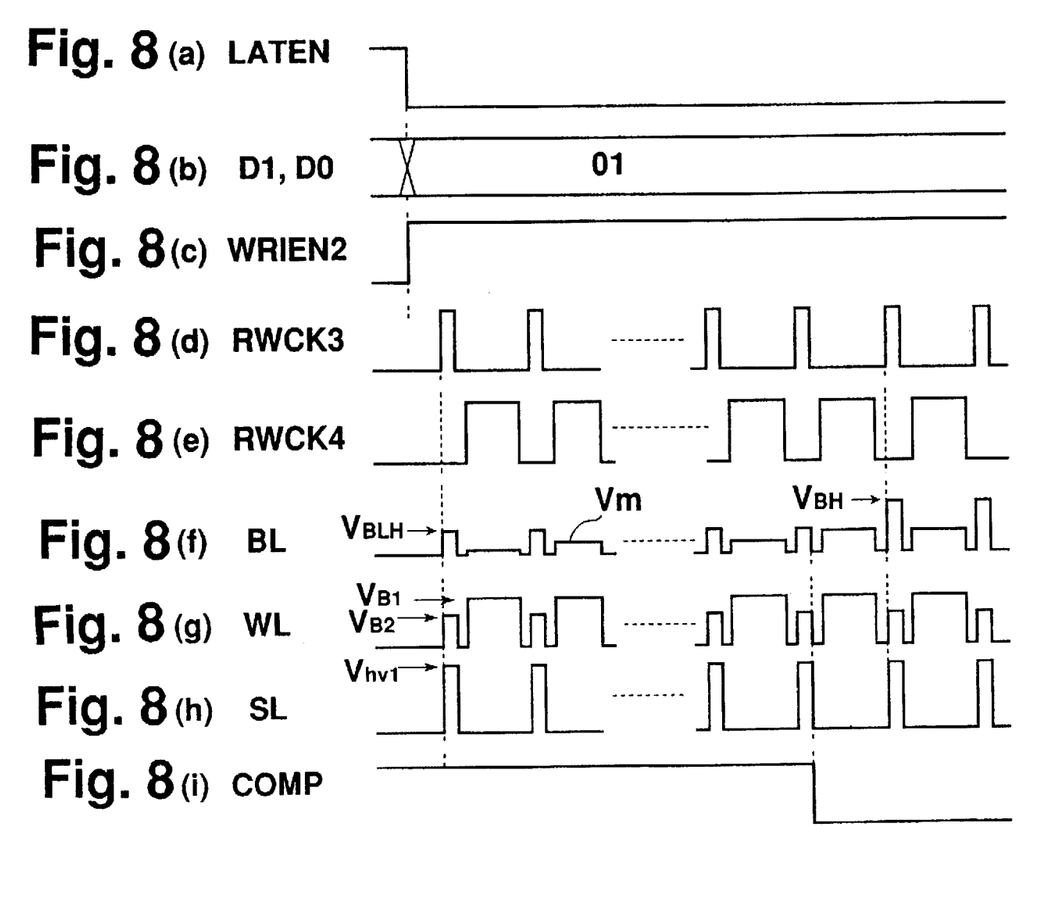
FIG. 8 is a timing chart depicting write mode operation of
a read-writing circuit in an embodiment of the present
invention.

If the comparison shows that Vdec>Vm, the output of the comparator 23 remains at the H level and the writing operation based on the clock RWCK 3, the reading operation is based on the clock RWCK 4 and the comparing operation described above are repeated. By repeating the writing operation, is the amount of charge injected to the floating gate FG increases and the reading voltage Vm rises as shown in FIG. 8 (f). When Vdec≦Vm, the output of the comparator 23 and the output COMP of the latch circuit 24 both reverse to the L level. Consequently, the output of the AND gate 31 reverses from the H level to the L level, the P channel MOS transistor 26 switches to ON, the output of AND gates 32, 33 changes to the L level and both N channel MOS transistors 27, 28 switch to OFF. As a result, when the clock RWCK 3 has reached the H level, the bias voltage VBH is supplied to the bit line BL of the memory cell via the analog switch 29 (see FIG. 8(f)). In other words, the write bias conditions depicted in FIG. 11 break down and the writing operation is terminated.

As described above, in write mode any one of 4 analog amounts corresponding to 2-bit inputted digital data is stored at a selected memory cell 60.

Figure 12:
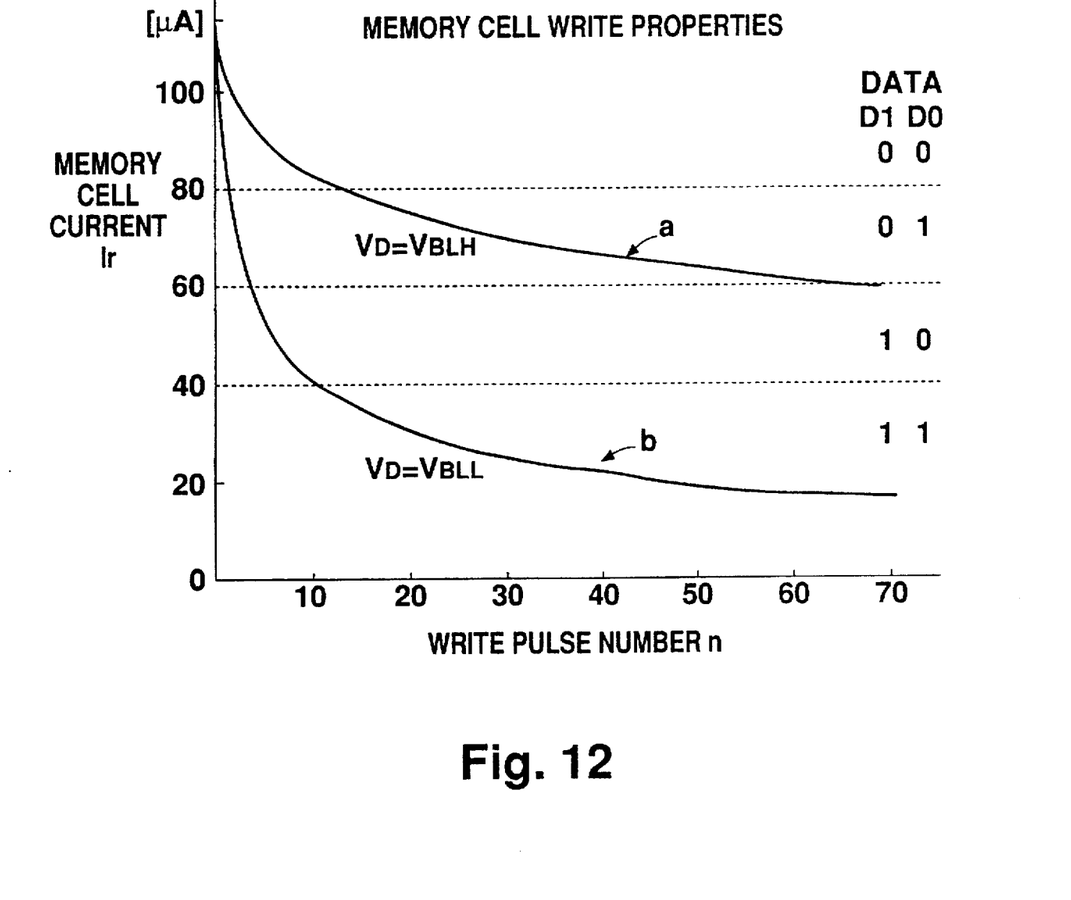
FIG. 12 is diagram showing writing characteristics of a memory cell in an embodiment of the present invention.

FIG. 12 shows the relation between the above-mentioned write pulse number n during writing operation and the memory cell current Ir, in which curve "a" indicates a case in which bias voltage VBLH has been applied to the drain and curve "b" indicates a case in which bias voltage VBLL has been applied to the drain.

When the write pulse number n increases, since the amount of charge injected to the floating gate increases and the memory cell threshold voltage Vt increases, the memory cell current Ir decreases. However, since the amount of charge injected to the floating gate per pulse gradually decreases, the memory cell current decrease rate is also gradually reduced.

As curve "a" shows, when the comparatively high voltage VBLH is used as the bias voltage to be applied to the drain, the memory cell current value corresponding to data "0, 1" is 80 µA when approximately 15 pulses are applied and a read voltage of about V2 is obtained when reading is executed, but a write pulse of over 60 pulses has to be applied in order to obtain a memory cell current value 60 µA (this being the current value which corresponds to read voltage V3) corresponding to data "1, 0".

Therefore, according to the circuit configuration of this embodiment shown in FIG. 1, since the bias voltage applied to the drain is switched from VBLH to the lower VBLL when the upper data bit D1 is "1", the amount of charge injected to the floating gate per pulse increases. Consequently, as curve "b" shows, a memory cell current value 60 µA corresponding to data "1, 0" is thus obtained with approximately 4 pulses, and a memory cell current value 40 µA (this being the current value which corresponds to read voltage V4) corresponding to data "1, 1" is obtained with approximately 11 pulses.

In other words, writing can be carried out in a shorter time period by switching the bias voltage value supplied to the drain in accordance with the data to be written.

Operation in read mode will next be explained with reference to FIG. 9.

Figure 9:
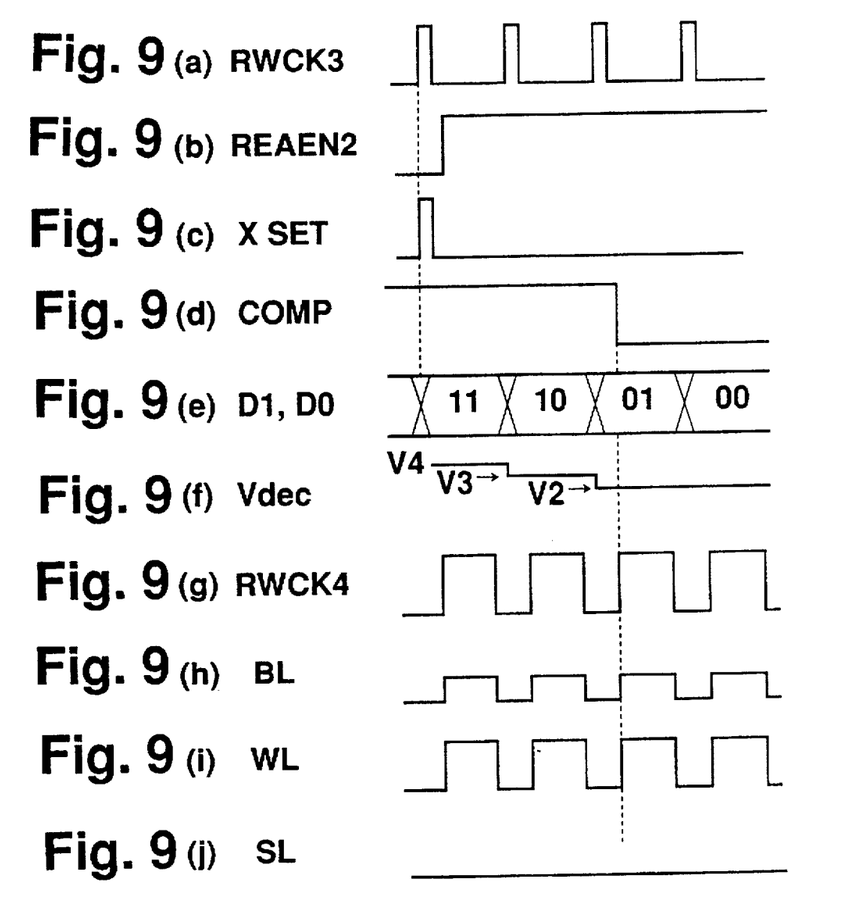
FIG. 9 is a timing chart depicting read mode operation of
a read-writing circuit in an embodiment of the present
invention.

In read mode, when signal XSET (FIG. 9 (c)) rises to the H level, an initial value of ALL "1" is set in the data register 20 (FIG. 9 (e)) and an analog voltage V4 corresponding to ALL "1" is outputted from the decoder 22 as shown in FIG. 9 (f). When the clock RWCK 4 then rises to the H level as shown in FIG. 9 (g), since the bias conditions for the memory cell 60 are exactly the same as those in when executing read operation in write mode, the inverting terminal of the comparator 23 obtains a voltage Vm corresponding to the charge injected at the floating gate of the selected memory cell and compares this voltage Vm with the voltage V4 outputted from the decoder 22. If this comparison shows that Vm>V4, the comparator 23 and the latch circuit 24 output COMP change to the L level and therefore the output of the NAND gate 39 rises to the H level. Since the output of the NAND gate 38 is fixed at the H level in this time, the output of the NAND gate 41 now changes to the L level and the ALL "1" value thus remains held in the data register 20 without any subsequent latching.

Alternatively, if the result of the comparison is that Vm≦V4, the comparator 23 and the latch circuit 24 output COMP change to the H level and therefore when the clock RWCK 3 rises to the H level as FIG. 9 (a) shows, the output of the NAND gate 39 changes to the L level. Consequently, the NAND gate 41 outputs a clock signal to the data register 20 and the data register 20 latches the data supplied by the data input line 45. During read mode, since data "D1, D0" at "10", "01" and "00" are outputted sequentially from the down counter 801 shown in FIG. 2 on this data input line 45 each time the clock RWCK 4 changes to L level, after data "11" the data register 20 latches data "10" as shown in FIG. 9 (e). When the decoder 22 output Vdec then decreases to voltage 3 as shown in FIG. 9 (f) and the clock RWCK 4 reverts to the H level, the comparator 23 compares the voltage V3 with the voltage Vm corresponding to the analog amount read from the memory cell. If Vm>V3, the comparator 23 and the latch circuit 24 output COMP reverse to the L level and "10" is thus held in the data register 20 without any subsequent latching. If the comparison result shows that Vm≦V3, the comparator 23 and the latch circuit 24 output COMP remain at the H level and therefore the data register 20 latches the next data "01" and the comparator 23 compares V2 with Vm. If this comparison shows that Vm>V2, the data register 20 content is fixed at "01", but if Vm≦V2, the data register 20 latches the final data "00" and the comparator 23 compares Vm and V1. Since voltage V1 is set a approximately 0 V, the final comparison shows that Vm>V1 and the content of the data register 20 is fixed at "00".

Figure 2:
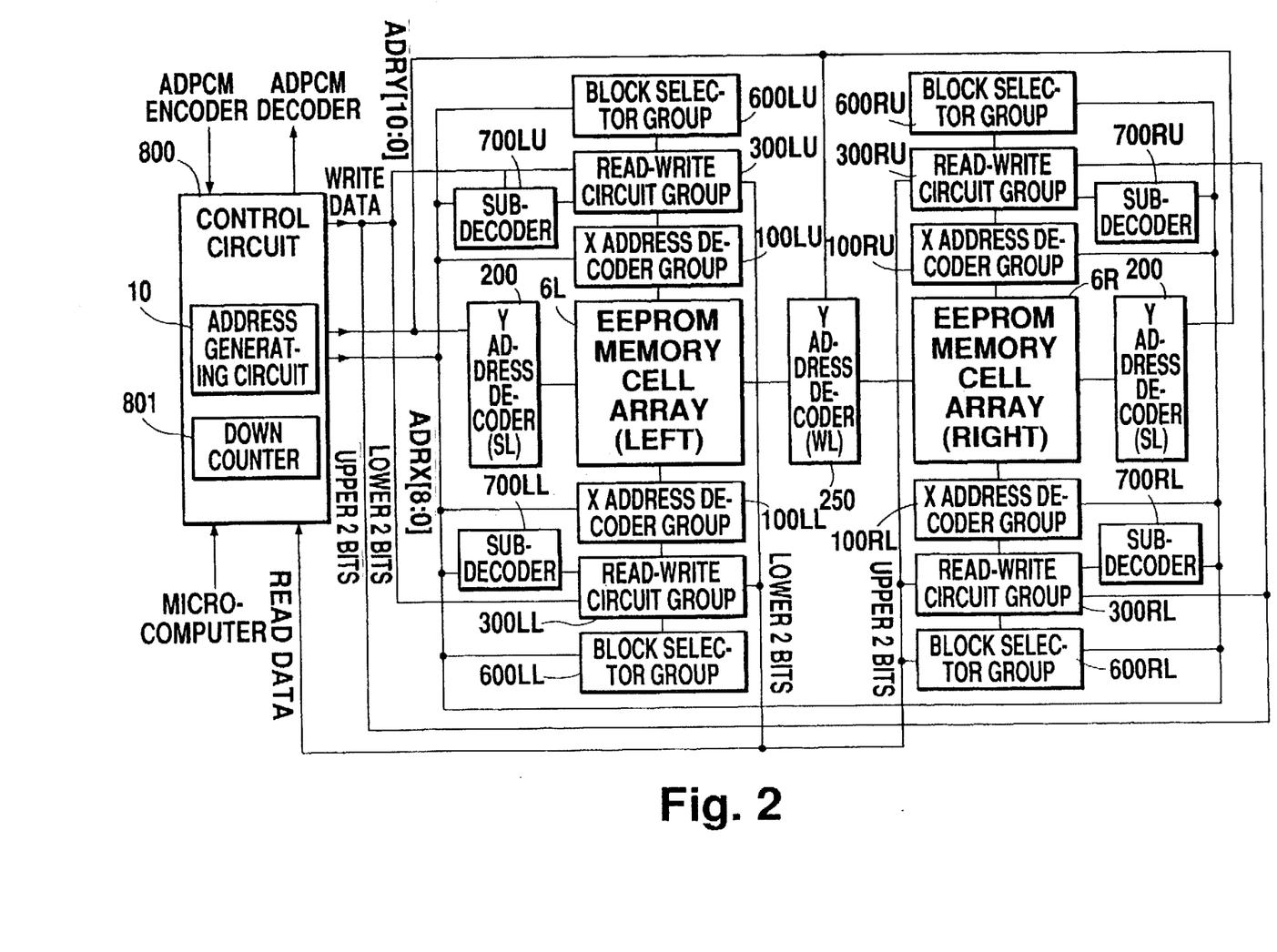
FIG. 2 is a block diagram depicting a pair of left-right
memory cell arrays and their peripheral circuits in an
embodiment of the present invention.

As the above description shows, a voltage Vm corresponding to an analog amount read from a memory cell is AD converted by a data register 20, a resistance dividing circuit 21, a decoder 22, a comparator 23, a NAND gate 39 and a NAND gate 41 and is then sent to an external portion through an output buffer 25. In other words, these are the circuits which comprise the second AD converter 5 depicted in FIG. 5. In the read-writing circuit 300 described above, 2-bit digital data were converted to 4 analog amounts and any one of four analog amounts is written in a single memory cell. In fact, however, the ADPCM converter 2 outputs 4-bit digital data. Therefore in this example, the upper 2 bits (i/j bits) of the 4-bit (i-bit; i>j; j = the number of the memory cell array) digital data are stored in the right memory cell array 6R, and the lower 2 bits (i/j bits) are stored in the left memory cell array 6L as shown in FIG. 2. The storing operation for both these arrays is of course carried out by the above-mentioned read-writing circuit 300 shown in FIG. 1. After the 2 bits of digital data have been converted to 4 analog amounts these are stored respectively in multi-state memory cells.

In FIG. 2, 800 is a control circuit connected to a microcomputer 9, an ADPCM encoder 2 and an ADPCM decoder 7. This control circuit 800 includes a down counter 801 for outputting a down count value for AD conversion when executing reading and an address generating circuit 10. In addition to transmitting a 9-bit X address ADRX, an 11-bit Y address decoder address ADRY and 4-bit data, the control circuit 800 outputs all the clock signals and control signals shown in FIG. 1, and also temporarily captures digital data corresponding to analog amounts read from memory cells and sends them to the ADPCM decoder 7.

Moreover, the upper side of the right memory cell array 6R is equipped with a block selector group 600 RU, a read-writing circuit group 300 RU, an X address decoder 100 RU and a subdecoder 700 RU. Symmetric with these, the lower side of the memory cell array 6R is also equipped with a block selector group 600 RL, a read-writing circuit group 300 RL, an X address decoder group 100 RL and a subdecoder 700 RL. The left memory cell array 6L is equipped identically to the right memory cell array. Above it are a block selector group 600 LU, a read-writing circuit group 300 LU, an X address decoder group 100 LU, and a subdecoder 700 LU. Below it are a block selector group 600 LL, a read-writing circuit group 300 LL, an X address decoder group 100 LL and a subdecoder 700 LL.

The above-mentioned circuit configurations corresponding to the right memory cell array 6R and the left memory cell array 6L are entirely identical. Moreover, since the inputted address signals are also identical, these memory cells operate in exactly the same way. The configuration of the Y address decoders 200 and 250 is identical to that shown in FIG. 1. A second bias generating circuit 400 (not shown in FIG. 2) identical to that shown in FIG. 1 is also provided for supplying bias voltages such as Vhv1, Vhv2 to the decoders 200 and 250. The left memory cell array 6L and the surrounding circuits will next be explained with reference to FIG. 3.

Figure 3:
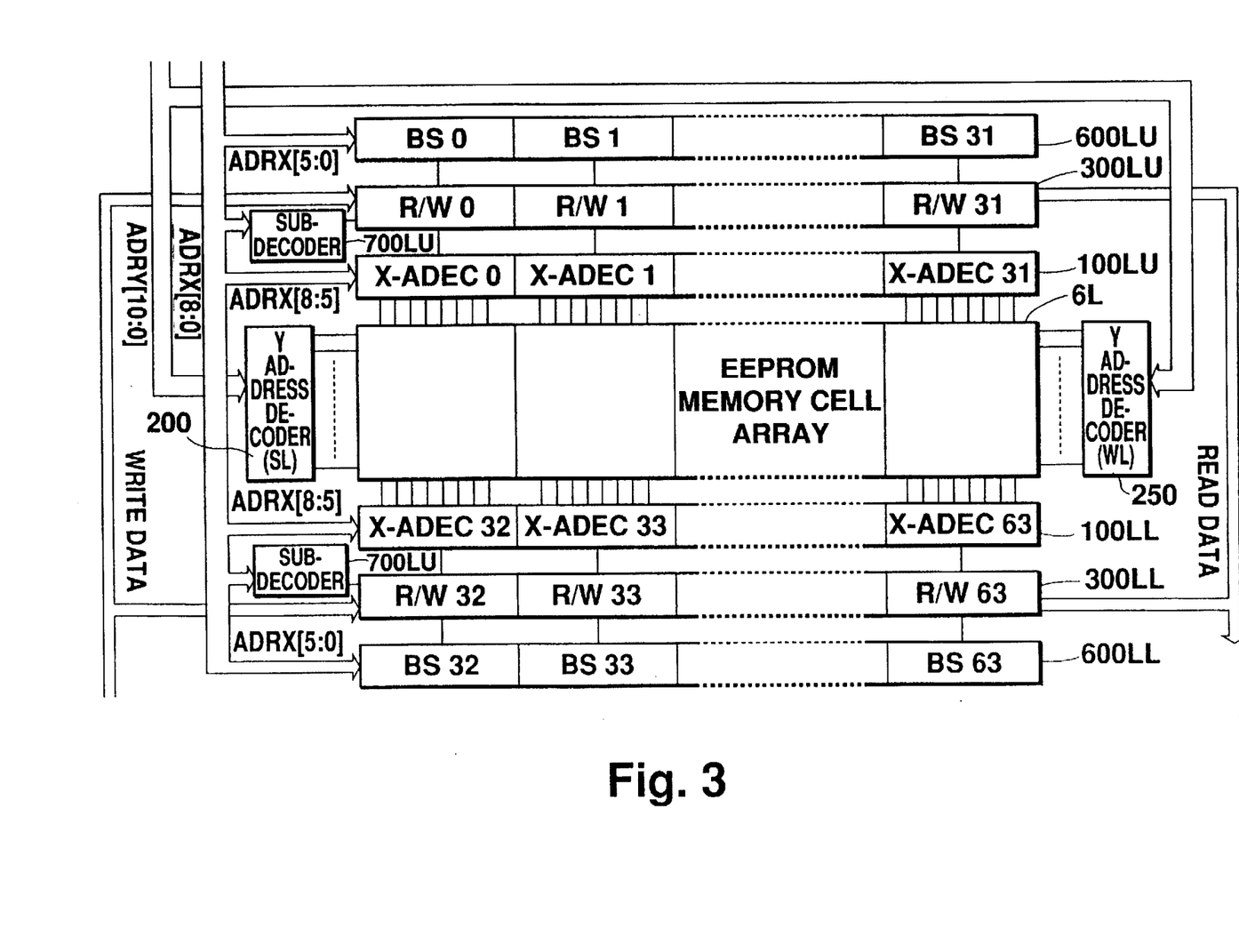
FIG. 3 is a block diagram depicting a left memory cell
array and its surrounding circuits in an embodiment of the
present invention.

The memory cell array 6L in FIG. 3 is split-managed by 32 blocks above and below it and each of these blocks is equipped with a block selector BS, a read-writing circuit R/W and an X address decoder X-ADEC. Thus, block selector groups 600LU and 600LL each consist of 32 block selectors BS, read-writing circuit groups 300LU and 300LL each consist of 32 read-writing circuits R/W, and X address decoder groups 100LU and 100LL each consist of 32 X address decoders X-ADEC. The read-writing circuits R/W of all the blocks in FIG. 3 have exactly the same configuration as the read-writing circuit 300 shown in FIG. 1 and the X address decoders X-ADEC are also configured identically to the X address decoder 100 shown in FIG. 1. However, since each block selector BS detects the selection of its own block, a different address is inputted to each block to ensure that H level is outputted only when an X address ADRX [5:0] indicating that block selector's own block No. has been inputted.

Operation in data write mode will now be explained with reference to FIG. 6.

Figure 6:
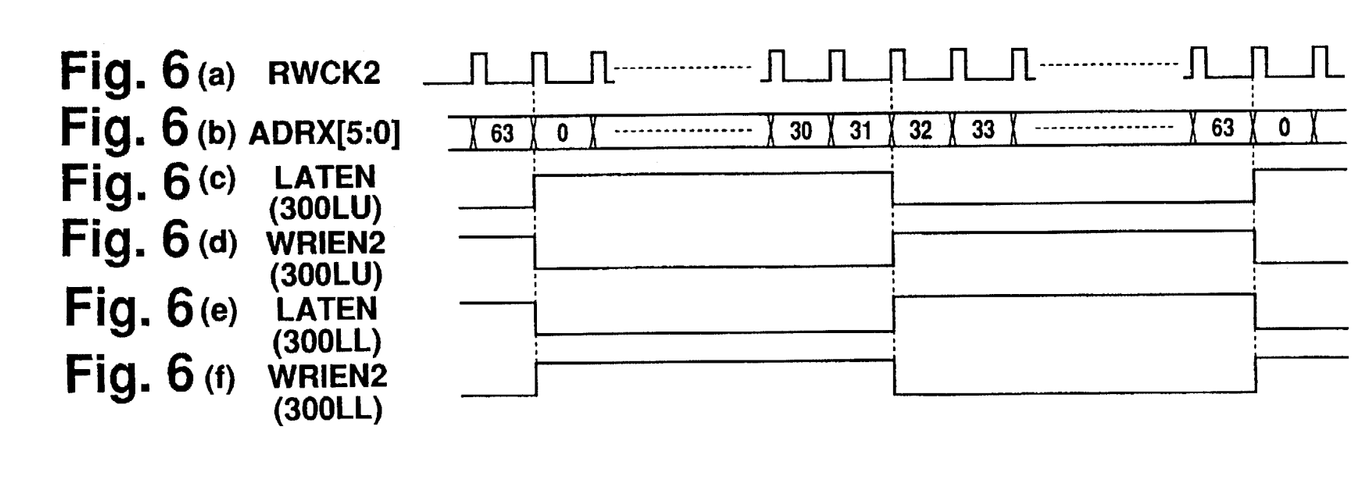
FIG. 6 is a timing chart depicting latch mode and write
mode operations of a read-writing circuit group in an
embodiment of the present invention.

Since addresses sent from the address generating circuit 10 shown in FIG. 2 are sequentially updated, the lower 6-bit address X address ADRX [5:0] first changes as shown in FIG. 6 (b); and in compliance with the change in this X address ADRX [5:0], all the select outputs BSEL of all the block selectors BS0~BS 31 from block No. 0 to block No. 31 in the upper block selector group 600LU change sequentially to the H level. During this period, the latch-enable signal LATEN and write-enable signal WRIEN 2 supplied to the upper read-writing circuit group 300LU change respectively to the H level and the L level as shown in FIG. 6 (c) (d), and therefore the sampled data are latched sequentially by each data register 20 within each corresponding read-writing circuit R/W from block No. 0 to block No. 31. Moreover, X address ADRX [5:0] is updated as FIG. 6 (b) shows; and in compliance therewith, all the select outputs BSEL of all the block selectors BS32~BS63 from block No. 32 to block No. 63 in the lower block selector group 600LL change sequentially to the H level. Since the latch-enable signal LATEN rises to the H level during this period as shown in FIG. 6 (e), the sampled data are latched sequentially by the data register 20 within each corresponding read-writing circuit R/W from block No. 32 to block No. 63 in the lower read-writing circuit group 300LL. In addition, since the write-enable signal WRIEN 2 supplied to the upper read-writing circuit group 300LU simultaneously rises to the H level during this period, as shown in FIG. 6 (d), all blocks Nos. 0~31 execute writing simultaneously. However, since at each block the X address decoder X-ADEC selects one bit line BL based on the upper 8-bit X address ADRX [8:5] supplied to this X address decoder X-ADEC, and the Y address decoders 200 and 250 respectively select one source line source line SL and one word line WL, writing is resultantly executed simultaneously in the selected upper 32 memory cells.

After writing has been executed, address ADRX [5:0] reverts to "0" and is again sequentially updated, and thus the data registers 20 of each block in the upper read-writing circuit group 300LU sequentially latch the 32 sampling data which are to be inputted next. Since the write-enable signal WRIEN 2 supplied to the lower read-writing circuit group 300LL rises to the H level while this latching operation is being carried out, writing is executed simultaneously in the 32 selected memory cells of all the lower blocks Nos. 32~63.

The upper read-writing circuit 300LU and the lower read-writing circuit 300LL thus carry out the data latching and writing operations alternately. Therefore, even if the writing time exceeds the time taken for 1 sampling, writing can be effectively executed without the need to create vacant time.

Read mode operation will next be explained with reference to FIG. 7.

Figure 4:
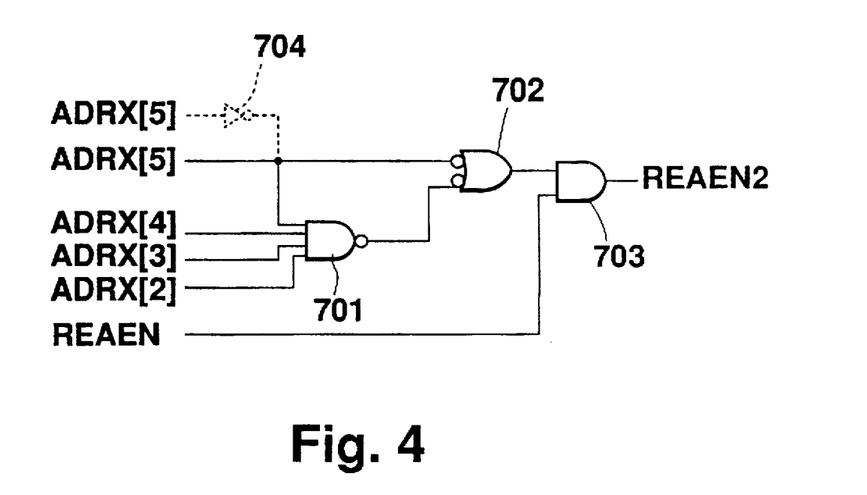
FIG. 4 is a diagram showing a detailed example of a
configuration of a subdecoder in an embodiment of the
present invention.

As indicated by the solid lines in FIG. 4, a subdecoder 700LU consists of a NAND gate 701 for inputting an X address ADRX [5:2], a NAND gate 702 which inputs an address ADRX [5] and the output from NAND gate 701 and an AND gate 703. The AND gate 703 is inputted a signal REAEN which is already at the H level during read mode and the output from NAND gate 702 and outputs them as the read-enable signal REAEN2 shown in FIG. 1. In addition, a subdecoder 700LL has a configuration identical to that of the subdecoder 700LU with the exception that instead of the address ADRX [5] it inputs the reverse signal of this address, as indicated by the dotted line in FIG. 4.

Figure 7:
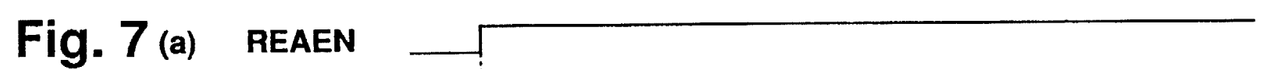
FIG. 7 is a timing chart depicting read mode operation of
a read-writing circuit group in an embodiment of the present
invention.

In read mode, the address ADRX [5:0] is updated as shown in FIG. 7 (b); and when the address reaches "60", the entire bit output of ADRX [5:2] rises to the H level. The output of the NAND gate 701 at the subdecoder 700LU thus changes to the L level, and consequently the output of NAND gate 702 changes to the H level. As a result, the AND gate 703 output REAEN2 rises to the H level as shown in FIG. 7 (c). Therefore, reading of data from 32 memory cells Nos. 0~31 commences simultaneously at the upper read-writing circuit group 700LU. This reading operation is longer than one sampling period (period in which an address is updated only one state), in this case lasting for approximately 3 sampling periods, and the operation ceases until the address returns to "0".

The period which the output of the NAND gate 701 is at the H level, continues from the address "60" until reaching the address "63" and the output changes to the L level when the address returns to "0". However, since ADRX [5] is already at the L level while the address is between "0" and "31", the output of NAND gate 702 rises to the H level and the subdecoder 700LU output REAEN2 continues to maintain H level output as shown in FIG. 7 (c). When ADRX [5:0] changes from "0" to "31", block selectors BS of blocks Nos. 0 to 31 sequentially output H level. Consequently, an output buffer 25 (see FIG. 1) comprising a transmission circuit opens in each of the corresponding read-writing circuits R/W and the contents of data register 20 are sequentially outputted.

Alternatively, at the subdecoder 700LL when address ADRX [5:0] reaches "28", the reverse output of address ADRX [5] and each bit output of ADRX [4:2] all change to the H level, and thus the NAND gate 701 output also rises to the H level. As a result, the output of the NAND gate 702 rises to the H level and consequently the AND gate 703 output REAEN2 rises to the H level as shown in FIG. 7 (d). Therefore, reading of data from 32 memory cells commences simultaneously at the lower read-writing circuit group 300LL. The output of NAND gate 701 then maintains the H level up until the address reaches "31" and changes to the L level when the address reaches "32". Since the reverse output of ADRX [5] is already at the L level while the address is between "32" and "63", the lower read-writing circuit group 300LL output REAEN2 continues to maintain H level output as shown in FIG. 7 (d). While the address is changing from "32" to "63", block selectors BS of blocks Nos. 32 to 63 sequentially output the H level. Consequently, an output buffer 25 (see FIG. 1) comprising a transmission circuit opens in each of the respective corresponding read-writing circuits R/W and the contents of data register 20 are sequentially outputted.

The above-mentioned subdecoders 700LU and 700LL form one part of a control circuit which together with a control circuit 800 and the like controls reading of upper and lower data of the memory cell array 6L. The subdecoder 700LL comprises a detecting circuit for detecting the specification of one of the data register (block No. 28) of the read-writing circuit group 300LU while a transmission circuit group consisting of an output buffer installed within the read-writing circuit 300LU is transmitting the upper data of memory cell array 6L. Furthermore, subdecoder 700LU comprises a detecting circuit for detecting the specification of one of the data register (block No. 60) of the read-writing circuit group 300LL, while a transmission circuit group consisting of an output buffer installed within the read-writing circuit 300LL is transmitting the lower data of memory cell array 6L.

Reading of the upper side of memory cell array 6L commences in response to change to the H level of a read-enable signal REAEN2 sent from the subdecoder 700LU (see FIG. 7 (c)) and reading of the lower side of memory cell array 6L commences in response to change to the H level of a read-enable signal REAEN2 sent from the subdecoder 700LL (see FIG. 7 (d)).

Thus unneeded vacant periods during read mode can be prevented by reading the contents of the data register 20 four sampling periods prior to commencing data output.

The above description related to the left memory cell array 6L shown in FIG. 2 based on FIG. 3, but the same operation is also carried out at the right-side memory cell array 6R as explained above. While there has been described what is at present considered to be a preferred embodiment of the invention, it will be understood that various modifications may be made to the present invention and it is intended that the appended claims cover all such modifications as fall within the true spirit and scope of the invention.

What is claimed is:

1. A non-volatile multi-state memory device comprising:

a non-volatile multi-state memory cell capable of storing a multi-state analog value;

a writing circuit for supplying a writing voltage to the memory cell based on a bias voltage selected from a plurality of bias voltages in order to write the multi-state analog value corresponding to inputted digital data, the selected bias voltage being selected based upon the inputted digital data; and a switching circuit for switching to the selected bias voltage.

2. A non-volatile multi-state memory device comprising:

a voltage generating circuit for generating a plurality of bias voltages;

a selecting circuit for selecting a bias voltage from the plurality of bias voltages, the selected bias voltage being selected based upon inputted digital data;

a non-volatile multi-state memory cell capable of storing a multi-state analog value; and a writing circuit for supplying a writing voltage to the memory cell based on the selected bias voltage in order to write the multi-state analog value corresponding to the inputted digital data.

3. A non-volatile multi-state memory device according to claim 1, wherein the memory cell consists of an EEPROM element.

4. A non-volatile multi-state memory device comprising:

a converting circuit for converting inputted digital data to a multi-state analog value;

a non-volatile multi-state memory cell capable of storing the multi-state analog value;

a comparator for comparing an analog value read from the memory cell with the analog value converted by the converting circuit;

a writing circuit for supplying a writing voltage to the memory cell based on a bias voltage selected from a plurality of bias voltages in response to a comparison result from the comparator in order to write the multi-state analog value, the selected bias voltage being selected based upon the inputted digital data; and a switching circuit for switching to the selected bias voltage.

5. A non-volatile multi-state memory device comprising:

a voltage generating circuit for generating a plurality of bias voltages;

a selecting circuit for selecting a bias voltage from the plurality of bias voltages, the selected bias voltage selected based upon inputted digital data;

a converting circuit for converting inputted digital data to a multi-state analog value;

a non-volatile multi-state memory cell capable of storing the multi-state analog value;

a comparator for comparing an analog value read from the memory cell with the analog value converted by the converting circuit;

a writing circuit for supplying a writing voltage to the memory cell based on a bias voltage selected from a plurality of bias voltages in response to a comparison result from the comparator in order to write the multi-state analog value, the selected bias voltage being selected based upon the inputted digital data; and a switching circuit for switching to the selected bias voltage.

6. A non-volatile multi-state memory device according to claim 4, the device further comprising:

a data register for holding the inputted digital data;

an analog voltage generating circuit for generating a plurality of analog voltages with different voltage values; and a decoder for decoding a content of the data held in the data register and selectively outputting one of the plurality of analog voltages in response to the content of the data, wherein the comparator compares a voltage corresponding to the analog value read from the memory cell with the analog voltage outputted from the decoder.

7. A non-volatile multi-state memory device according to claim 4, wherein the memory cell consists of an EEPROM element.

8. A non-volatile multi-state memory device according to claim 2, wherein the inputted digital data comprises n bits of data, and the selecting circuit selects any one of the plurality of bias voltages in response to a value of the upper m bits (m<n) of the inputted digital data.

9. A non-volatile multi-state memory device according to claim 8, wherein the selecting circuit further comprises:
switches for selectively supplying any one of the plurality of bias voltages to the memory cell; and
gate circuits for respectively controlling the ON/OFF states of the switches.

10. A non-volatile multi-state memory device according to claim 2, wherein
the memory cell comprises a transistor for holding the multi-state analog value,
a fixed-value high voltage is supplied to either a source or a drain of the transistor,
each of the plurality of bias voltages outputted from the voltage generating circuit is set at a voltage lower than the fixed-value high voltage; and
any one of the plurality of bias voltages selected by the selecting circuit is supplied to either the drain or the source not supplied by the fixed-value high voltage.

11. A non-volatile multi-state memory device according to claim 5, wherein
the inputted digital data comprises n bits of data, and the selecting circuit selects any one of the plurality of bias voltages in response to a value of the upper m bits (m<n) of the inputted digital data.

12. A non-volatile multi-state memory device according to claim 11, wherein the selecting circuit further comprises:
switches for selectively supplying any one of the plurality of bias voltages to the memory cell; and
gate circuits for respectively controlling the ON/OFF states of the switches.

13. A non-volatile multi-state memory device according to claim 5, wherein
the memory cell comprises a transistor for holding the multi-state analog value,
a fixed-value high voltage is supplied to either a source or a drain of the transistor,
each of the plurality of bias voltages outputted from the voltage generating circuit is set at a voltage lower than the fixed-value high voltage; and
any one of the plurality of bias voltages selected by the selecting circuit is supplied to either the drain or the source not supplied by the fixed-value high voltage.

14. A non-volatile multi-state memory device according to claim 2, wherein the memory cell consists of an EEPROM element.

15. A non-volatile multi-state memory device according to claim 5, the device further comprising:
a data register for holding the inputted digital data;
an analog voltage generating circuit for generating a plurality of analog voltages with different voltage values; and
a decoder for decoding a content of the data held in the data register and selectively outputting one of the plurality of analog voltages in response to the content of the data, wherein
the comparator compares a voltage corresponding to the analog value read from the memory cell with the analog voltage outputted from the decoder.

16. A non-volatile multi-state memory device according to claim 5, wherein the memory consists of an EEPROM element.

* * * * *